(12) United States Patent
Morris

(10) Patent No.: US 6,922,496 B2
(45) Date of Patent: Jul. 26, 2005

(54) INTEGRATED VCSELS ON ASIC MODULE USING FLEXIBLE ELECTRICAL CONNECTIONS

(75) Inventor: Terrel L. Morris, Garland, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1 day.

(21) Appl. No.: 10/355,663

(22) Filed: Jan. 31, 2003

(65) Prior Publication Data

US 2004/0150092 A1 Aug. 5, 2004

(51) Int. Cl.$^7$ .............................. G02B 6/12; H01S 5/00; H01L 21/44

(52) U.S. Cl. ........................... 385/14; 385/53; 385/88; 385/92; 385/94; 372/43; 372/97; 372/98; 257/688; 257/784; 257/692; 257/707; 257/723; 257/99; 438/617; 438/117; 438/125

(58) Field of Search ......................... 385/14, 53, 88, 385/92, 94; 372/43, 97, 98; 257/688, 784, 692, 707, 723, 99; 438/617, 117, 125

(56) References Cited

U.S. PATENT DOCUMENTS

| | | | |
|---|---|---|---|
| 5,978,401 A | 11/1999 | Morgan | 372/50 |
| 6,334,784 B1 | 1/2002 | Howard | 439/260 |
| 6,392,296 B1 | 5/2002 | Ahn et al. | 257/698 |
| 6,424,530 B1 | 7/2002 | Lee | 361/704 |
| 6,527,456 B1 | 3/2003 | Trezza | 385/89 |
| 6,635,861 B1 * | 10/2003 | Stone | 250/216 |
| 6,709,607 B2 * | 3/2004 | Hibbs-Brenner et al. | 216/24 |

OTHER PUBLICATIONS

A.F.J. Levi, "Optical Interconnects in Systems", 2000, pp. 1–8.

* cited by examiner

*Primary Examiner*—Brian M. Healy
(74) *Attorney, Agent, or Firm*—Leslie P. Gehman

(57) ABSTRACT

A circuit module including at least one Application Specific Integrated Circuit (ASIC) and a plurality of Vertical Cavity Surface-Emitting Laser (VCSEL) array modules is built using a standard ceramic or organic Multi-Chip Module (MCM) package substrate, resulting is a high density device with a small footprint. Interconnection between the electronic devices and the VCSEL array modules is accomplished using standard integrated circuit packaging technology and flexible connectors. Optical connections from the VCSEL arrays to fiber optic cables are made possible by integrating industry-standard optical connectors onto the package. Optical receiver and transceiver modules may also be incorporated into the circuit module.

32 Claims, 8 Drawing Sheets

INTEGRATED VCSELS ON ASIC MODULE USING FLEXIBLE ELECTRICAL CONNECTIONS

FIELD OF THE INVENTION

The present invention is related generally to the field of integrated circuit modules and more specifically to the field of integrated circuit modules including vertical cavity surface-emitting lasers.

BACKGROUND OF THE INVENTION

Vertical Cavity Surface Emitting Laser (VCSEL) arrays are often used in fiber optic communications. These VCSEL arrays are capable of transmitting large amounts of data over small optical fibers. A single ⅛ inch fiber bundle may carry an entire 12–20 bit logical port running at relatively high speeds. VCSEL arrays are constructed using semiconductor process techniques similar to those used in silicon integrated circuits, however, the process techniques used for VCSEL arrays may not be optimal for construction of high speed silicon integrated circuits. This makes it difficult to integrate VCSEL arrays and high speed circuits on the same silicon device.

Many current uses of VCSEL technology require precise performance specifications in order to transmit signals over long distances via optical fibers. However, in situations where only short distances are required, such as within a computer server or within a single data center, less stringent performance specifications are required of the VCSEL arrays.

Currently, some circuit boards include VCSEL array modules and receiver modules for communication between computers. Typically, these modules are placed along one edge of the board and electrically connected to one or more electronic devices attached to the board. These solutions work well, however as computer speeds continue to increase, the delay inherent in driving signals out of an electronic device, into a board, along a board electrical connector, and into a VCSEL array module becomes increasingly troublesome to engineers designing high-speed computers.

Further, board space may be very expensive and in short supply especially in devices such as desktop systems or blade servers. The footprint of separate VCSEL array modules and, if needed, their translator/terminator devices may become a substantial portion of total board area, thus increasing size and costs of the computer.

SUMMARY OF THE INVENTION

A circuit module including at least one Application Specific Integrated Circuit (ASIC) and a plurality of Vertical Cavity Surface-Emitting Laser (VCSEL) array modules is built using a standard ceramic or organic Multi-Chip Module (MCM) package substrate, resulting is a high density device with a small footprint. Interconnection between the electronic devices and the VCSEL array modules is accomplished using standard integrated circuit packaging technology and flexible connectors. Optical connections from the VCSEL arrays to fiber optic cables are made possible by integrating industry-standard optical connectors onto the package. Optical receiver and transceiver modules may also be incorporated into the circuit module.

Other aspects and advantages of the present invention will become apparent from the following detailed description, taken in conjunction with the accompanying drawings, illustrating by way of example the principles of the invention.

DETAILED DESCRIPTION

Figure 1:
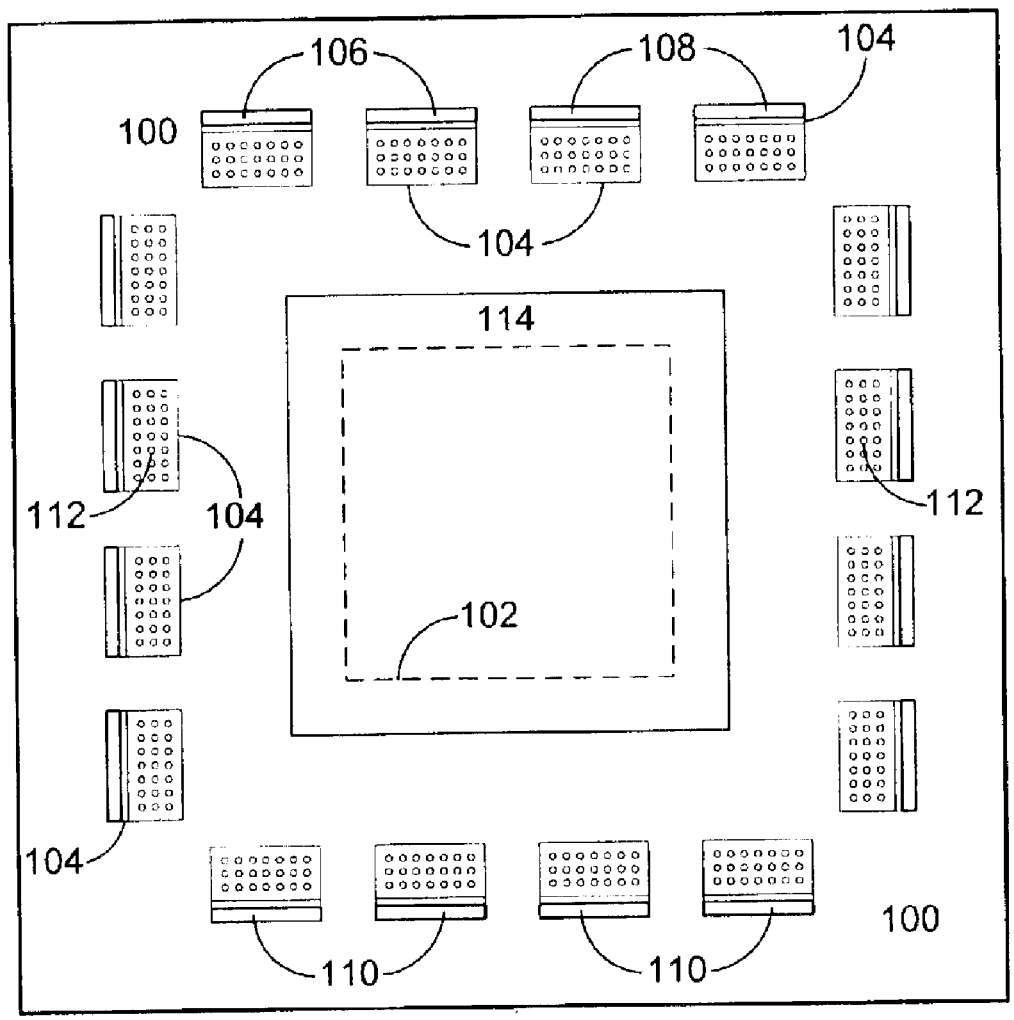
FIG. 1 is a top view of an example embodiment of a multi-chip module including a plurality of integrated VCSEL array modules according to the present invention.

FIG. 1 is a top view of an example embodiment of a multi-chip module including integrated VCSEL array modules according to the present invention. A standard Multi-Chip Module (MCM) substrate 100 constructed of a common package material, such as a ceramic or organic material, is shown in this example embodiment of the present invention with a single large application specific integrated circuit (ASIC) 102 attached to the substrate 100 underneath a standard heat spreader 114.

Another invention including integrated VCSELs is described in a U.S. patent application. Ser. No. 10/318,473, "Circuit Module Including Integrated VCSELs", filed on Dec. 12, 2002, and incorporated herein by reference. Another invention including VCSELs on Multi-Chip Module (MCM) substrates is described in a U.S. patent application, Ser. No. 10/355,419, "Integrated VCSELs on Traditional VLSI Packaging", filed on Jan. 31, 2003, and incorporated herein by reference. The ASIC 102 may be any one of a number of integrated circuit devices, such as a microprocessor, memory, cross-bar, cache controller, FPGA, or any of a number of large scale integrated (LSI) or very large scale integrated (VLSI) circuits. Also present on the substrate are a quantity of VCSEL array modules 106, receivers 108, and transceivers 110. Signal ports 112 connect the ASIC 102 to the VCSEL array modules 106, receivers 108, and the transceivers 110 through small flexible connectors 104. The small flexible connectors 104 allow a 90-degree transition in signal direction in an electrical rather than an optical path resulting in less complexity and ease of manufacturing. Since the light beam from a VCSEL is emitted perpendicular to the surface of the VCSEL, when a VCSEL is attached to the flexible connector 104 which includes a 90-degree bend, the VCSEL itself is now perpendicular to the plane of the MCM substrate 100 and the light from the VCSEL is emitted in a plane parallel to that of the MCM substrate 100. The plurality of signal lines connecting the ASIC 102 to the signal ports 112 within the MCM substrate 100 are not shown in this figure for clarity reasons. In an example embodiment of the present invention the VCSEL array modules 106 may incorporate industry standard optical connectors into the module allowing optical connection from the VCSEL array modules 106 using industry standard connections. In this example embodiment of the present invention, the VCSEL circuit is perpendicular to the plane of the substrate 100 and the industry standard connectors are attached such that light is transmitted in a plane parallel to that of the substrate 100. Note that this example embodiment shows a total of 16 VCSEL array modules 106, receivers 108 and transceivers 110. Those of skill in the art will recognize that any number and any combination of VCSEL array modules 106, receivers 108, and transceivers 110 may be used within the scope of the present invention.

Figure 2:
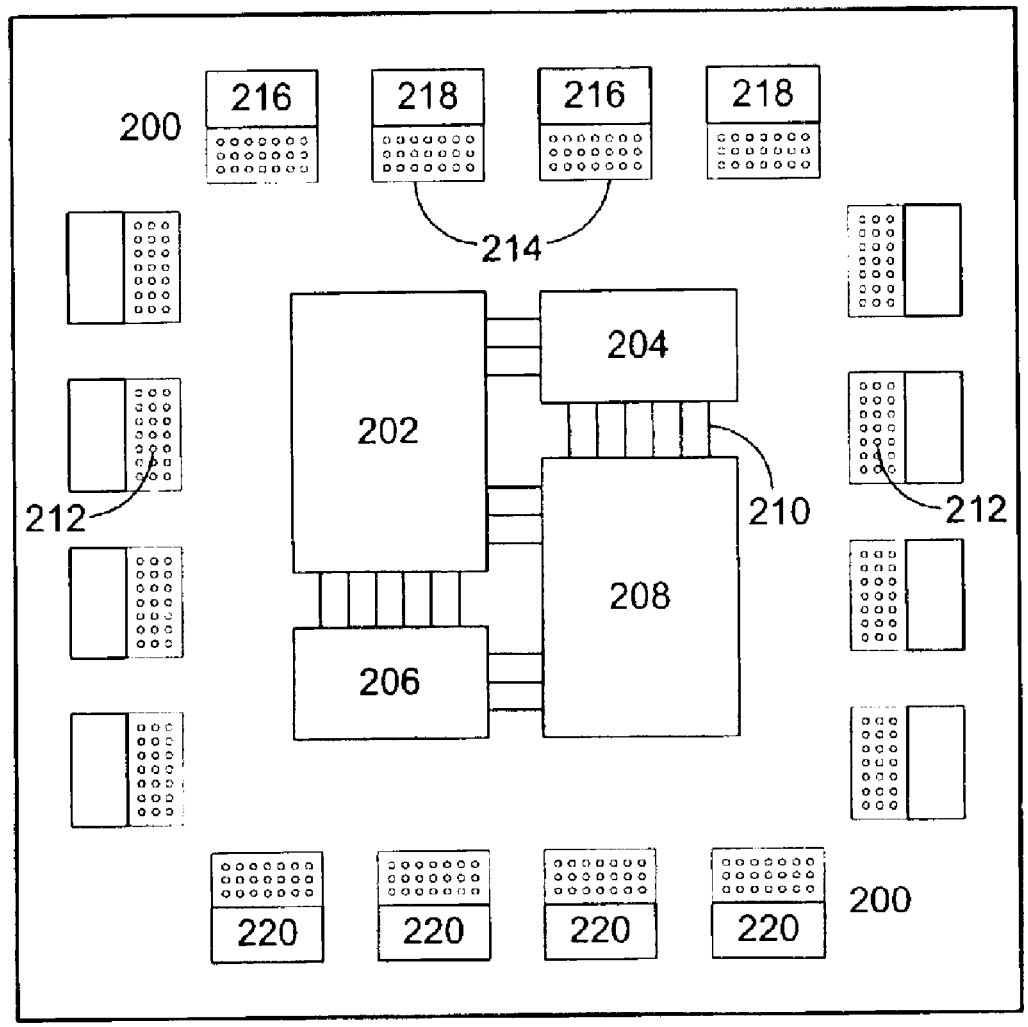
FIG. 2 is a top view of an example embodiment of a multi-chip module including a plurality of integrated VCSEL array modules according to the present invention.

FIG. 2 is a top view of an example embodiment of a multi-chip module including a plurality of integrated VCSEL array modules according to the present invention. The example embodiment of the present invention shown in FIG. 2 is similar to that of FIG. 1 with the exception that instead of a single ASIC 102 attached to a MCM substrate 100, a first ASIC 202, a second ASIC 204, a third ASIC 206, and a fourth ASIC 208 are attached to the MCM substrate 200. Also, FIG. 2 does not include a heat spreader so that the individual ASICs and their interconnections are visible. Signal ports 212 connect the ASICs 202, 204, 206, and 208 to the VCSEL array modules 216, receivers 218, and the transceivers 220 through small flexible connectors 214. The plurality of signal lines connecting the ASICs 202, 204, 206, and 208 to the signal ports 212 within the MCM substrate 200 are not shown in this figure for clarity reasons. In an example embodiment of the present invention the VCSEL array modules 216 may incorporate industry standard optical connectors into the module allowing optical connection from the VCSEL array modules 216 using industry standard connections. Similar to FIG. 1, in this example embodiment of the present invention, the VCSEL circuit is perpendicular to the plane of the substrate 200 and the industry standard connectors are attached such that light is transmitted in a plane parallel to that of the substrate 200. Note that this example embodiment shows a total of 16 VCSEL array modules 216, receivers 218 and transceivers 220. Those of skill in the art will recognize that any number and any combination of VCSEL array modules 216, receivers 218, and transceivers 220 may be used within the scope of the present invention. Also present in this example embodiment of the present invention are a plurality of signal lines 210 electrically connecting the four ASICs 202, 204, 206, and 208 to each other.

Figure 3A:
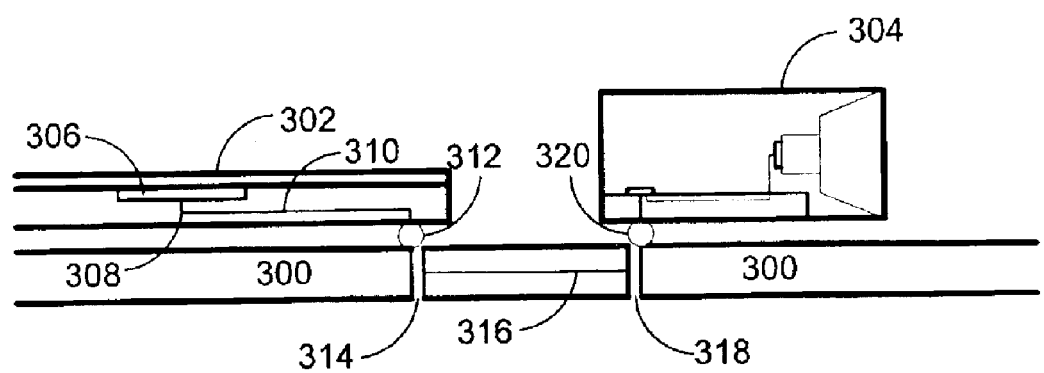
FIG. 3A is a cross-sectional view of an example embodiment of a prior art circuit module connecting to an external VCSEL.

FIG. 3A is a cross-sectional view of an example embodiment of a prior art circuit module connecting to an external VCSEL. An electronic device 306 is shown attached to a first package 302 through a C4 attach bump 308. Within the first package 302, a package trace 310 electrically connects the electronic device 306 to a first ball grid array (BGA) ball 312. This first BGA ball 312 electrically connects the first package 302 to a board 300. Within the board 300, a first board via 314 electrically connects the BGA ball 312 to a board trace 316, and through the board trace 316 to a second board via 318. This second board via 318 is electrically coupled to a second BGA ball 320 attached to a second package 304 containing a VCSEL.

Figure 3B:
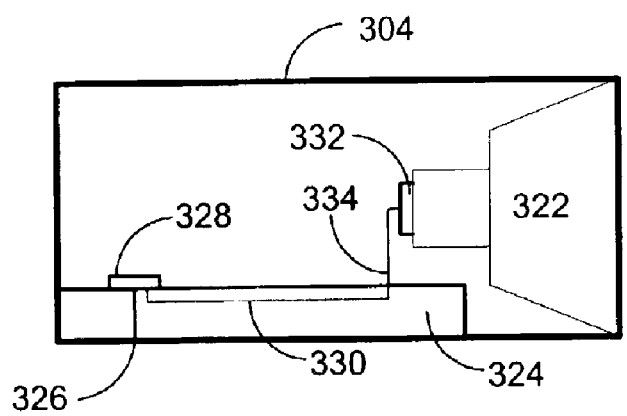
FIG. 3B is a cross-sectional view of the external VCSEL shown in FIG. 3A.

FIG. 3B is a cross-sectional view of the external VCSEL shown in FIG. 3A. Within the second package 304 a second package via 326 electrically couples the second BGA ball 320 to a package pad 328, which is in turn electrically connected to a VCSEL 332 through a second package trace 330 and a flexible electrical conductor 334. The VCSEL 332 is then optically coupled to an industry standard optical connector 322. Note that in this example embodiment of a VCSEL module, the VCSEL 332 is configured perpendicular to the board 300. Thus the light emitted from the VCSEL is in a plane parallel to the board 300 and the industry standard optical connector 322 is configured to route any optical conductors in a plane parallel to the board 300.

Figure 4:
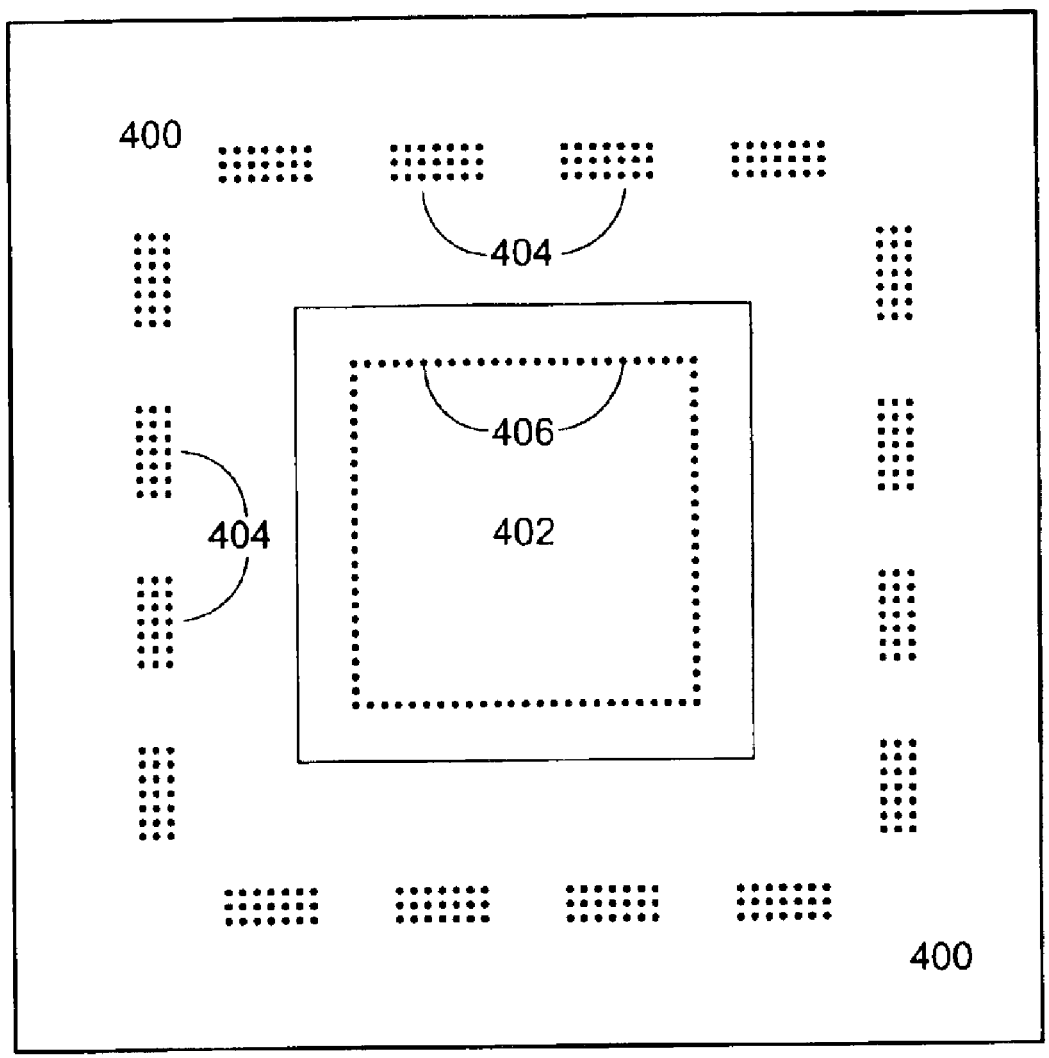
FIG. 4 is a top view of an example embodiment of a multi-chip module before attachment of a plurality of integrated VCSEL array modules according to the present invention.

FIG. 4 is a top view of an example embodiment of a multi-chip module substrate before attachment of a plurality of integrated VCSEL array modules according to the present invention. A standard MCM substrate 400 is shown including a cavity 402 and a plurality of signal ports 404. Within the cavity 402 are a plurality of ASIC signal ports 406 that are electrically connected to the signal ports 404 through conductors within the substrate 400. These conductors are not shown in this figure for clarity.

Figure 5:
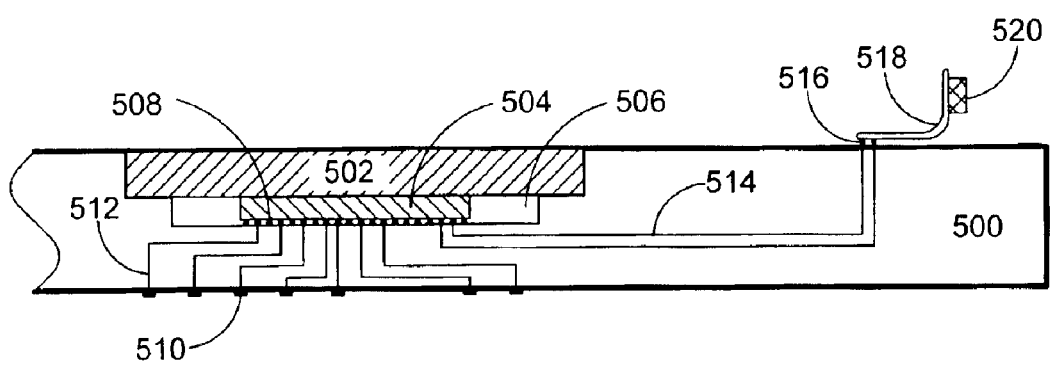
FIG. 5 is a cross-sectional view of an example embodiment of a multi-chip module including a plurality of integrated VCSEL array modules according to the present invention.

FIG. 5 is a cross-sectional view of an example embodiment of a multi-chip module including a plurality of integrated VCSEL array modules according to the present invention. A MCM substrate 500 is shown including a cavity 506. Within the cavity 506 is an ASIC 504 electrically connected to ASIC signal ports 508 on the substrate 500. Those of skill in the art will recognize that alternate package and heat spreader arrangements without a cavity may be used within the scope of the present invention. A heat spreader 502 is thermally coupled to the ASIC and mechanically coupled to the substrate 500 sealing the cavity 506. ASIC signal lines 512 run through the substrate 500 to standard MCM pads 510. Those of skill in the art will recognize that these package pads 510 may be constructed in a wide variety of styles and configurations within the scope of the present invention. For example, the MCM package may be a ball grid array (BGA) package and the MCM pads 510 would then comprise individual solder balls. VCSEL signal lines 514 run through the substrate 500 to VCSEL signal ports 516. A VCSEL array 520 is electrically connected to the VCSEL signal ports 516 through a small flexible circuit board 518. Since the light beam from a VCSEL is emitted perpendicular to the surface of the VCSEL, when a VCSEL is attached to the flexible circuit board 518 which includes a 90-degree bend, the VCSEL itself is now perpendicular to the plane of the substrate 500 and the light from the VCSEL is emitted in a plane parallel to that of the substrate 500. The small flexible circuit board 518 contains electrical traces configured to connect the VCSEL array 520 to the VCSEL signal ports 516.

Figure 6:
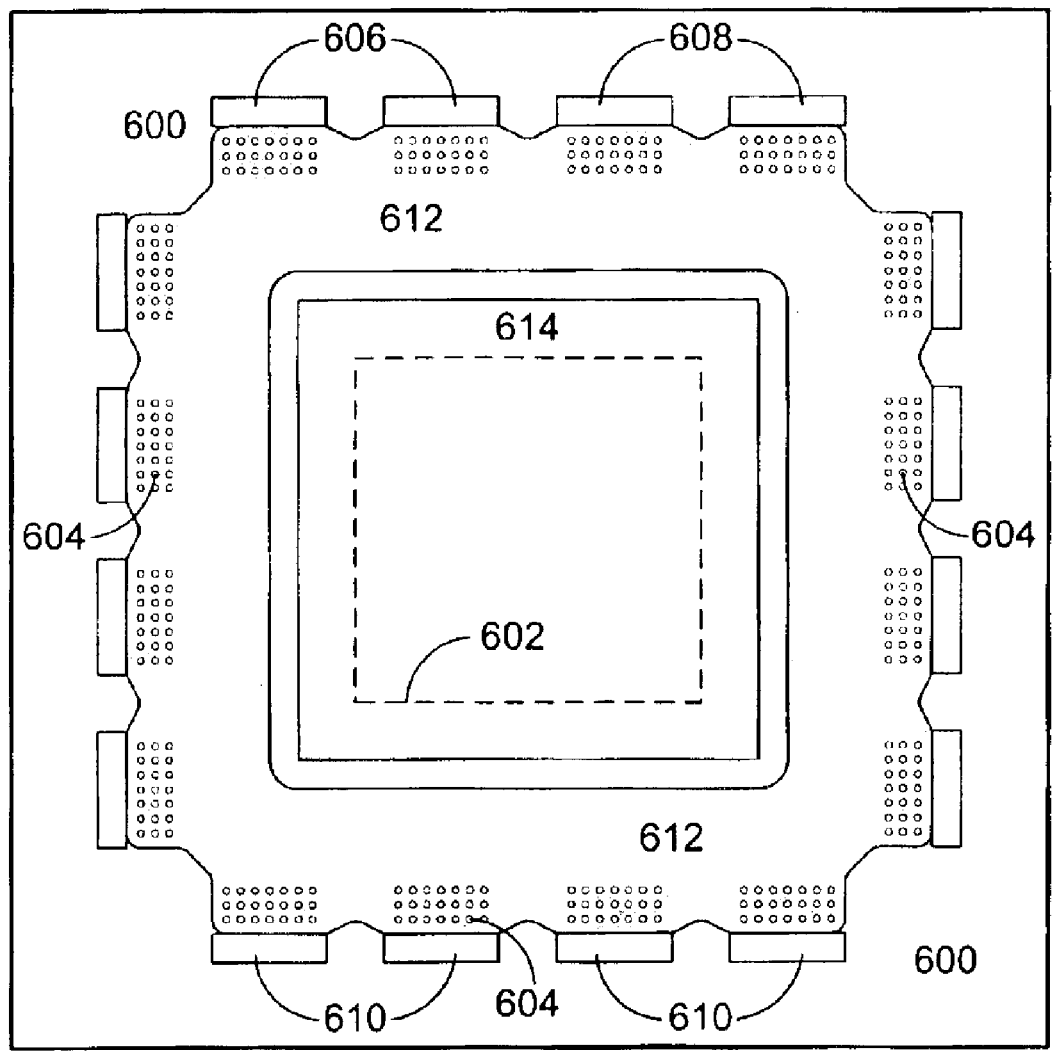
FIG. 6 is a top view of an example embodiment of a multi-chip module including a plurality of integrated VCSEL array modules according to the present invention.

FIG. 6 is a top view of an example embodiment of a multi-chip module including a plurality of integrated VCSEL array modules according to the present invention. A standard MCM substrate 600 constructed of a common package material, such as a ceramic or organic material, is shown in this example embodiment of the present invention with a single large application specific integrated circuit (ASIC) 602 attached to the substrate 600 underneath a standard heat spreader 614. The ASIC 602 may be any one of a number of integrated circuit devices, such as a microprocessor, memory, cross-bar, cache controller, FPGA, or any of a number of large scale integrated (LSI) or very large scale integrated (VLSI) circuits. Also present on the MCM substrate are a quantity of VCSEL array modules 606, receivers 608, and transceivers 610. Signal ports 604 connect the ASIC 602 to the VCSEL array modules 606, receivers 608, and the transceivers 610 through a single large flexible connector 612. The plurality of signal lines connecting the ASIC 602 to the signal ports 604 within the MCM substrate 600 are not shown in this figure for clarity reasons. In an example embodiment of the present invention the VCSEL array modules 606 may incorporate industry standard optical connectors into the module allowing optical connection from the VCSEL array modules 606 using industry standard connections. In this example embodiment of the present invention, the VCSEL circuit is perpendicular to the plane of the substrate 600 and the industry standard connectors are attached such that light is transmitted in a plane parallel to that of the substrate 600. Note that this example embodiment shows a total of 16 VCSEL array modules 606, receivers 608 and transceivers 610. Those of skill in the art will recognize that any number and any combination of VCSEL array modules 606, receivers 608, and transceivers 610 may be used within the scope of the present invention.

Figure 7:
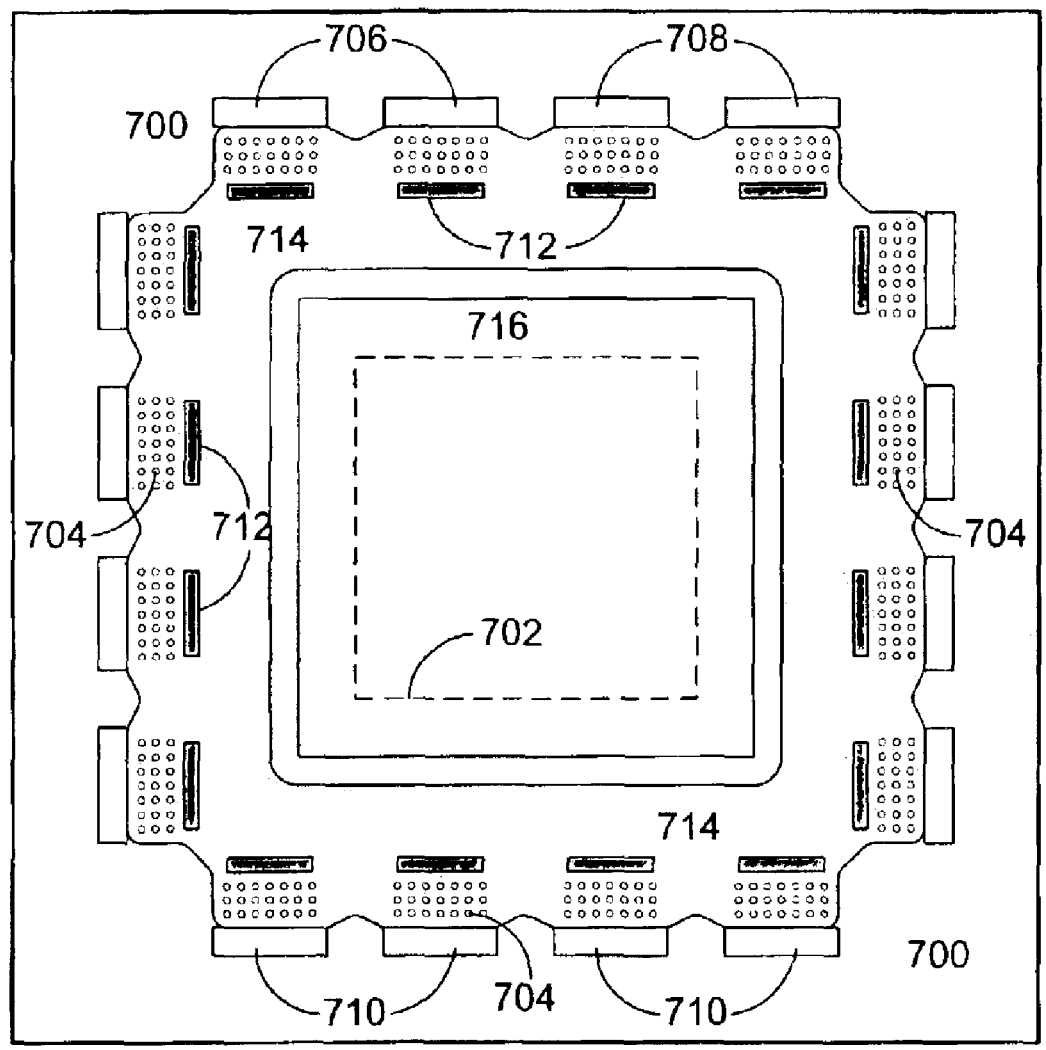
FIG. 7 is a top view of an example embodiment of a multi-chip module including a plurality of integrated VCSEL array modules according to the present invention.

FIG. 7 is a top view of an example embodiment of a multi-chip module including a plurality of integrated VCSEL array modules according to the present invention. FIG. 7 is identical to FIG. 6 with the exception that a plurality of terminators, translators, or other components are attached to the flexible connector. A standard MCM substrate 700 constructed of a common package material, such as a ceramic or organic material, is shown in this example embodiment of the present invention with a single large application specific integrated circuit (ASIC) 702 attached to the substrate 700 underneath a standard heat spreader 716. The ASIC 702 may be any one of a number of integrated circuit devices, such as a microprocessor, memory, crossbar, cache controller, FPGA, or any of a number of large scale integrated (LSI) or very large scale integrated (VLSI) circuits. Also present on the substrate are a quantity of VCSEL array modules 706, receivers 708, and transceivers 710. Signal ports 704 connect the ASIC 702 to the VCSEL array modules 706, receivers 708, and the transceivers 710 through a single large flexible connector 714. Also present on the large flexible connector 714 are a plurality of components 712 such as terminators or translators as needed between the ASIC 702 and the VCSEL array modules 706. The plurality of signal lines connecting the ASIC 702 to the signal ports 704 within the MCM substrate 700 are not shown in this figure for clarity reasons. In an example embodiment of the present invention the VCSEL array modules 706 may incorporate industry standard optical connectors into the module allowing optical connection from the VCSEL array modules 706 using industry standard connections. In this example embodiment of the present invention, the VCSEL circuit is perpendicular to the plane of the substrate 700 and the industry standard connectors are attached such that light is transmitted in a plane parallel to that of the substrate 700. Note that this example embodiment shows a total of 16 VCSEL array modules 706, receivers 708 and transceivers 710. Those of skill in the art will recognize that any number and any combination of VCSEL array modules 706, receivers 708, and transceivers 710 may be used within the scope of the present invention.

Figure 8:
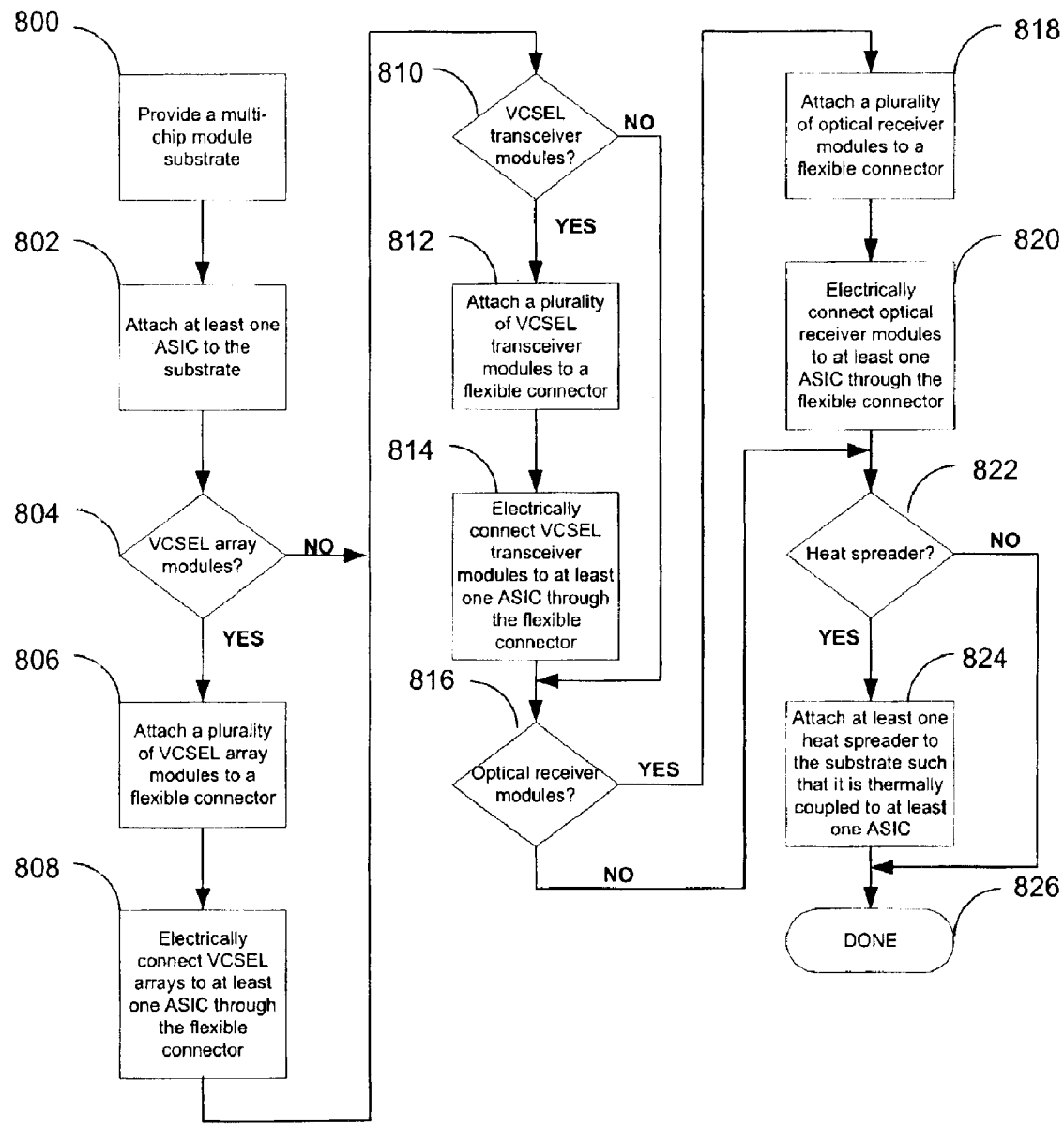
FIG. 8 is a flowchart representing a method for the construction of a multi-chip module including a plurality of integrated VCSEL array modules according to the present invention.

FIG. 8 is a flowchart representing a method for the construction of a multi-chip module including a plurality of integrated VCSEL array modules according to the present invention. In a step 800 a MCM substrate is provided. In a step 802 at least one ASIC is attached to the MCM substrate. In a decision step 804 if VCSEL array modules are to be used, control is passed to step 806, if not, control is passed to step 810. In a step 806, a plurality of VCSEL array modules are attached to a flexible connector. In a step 808, the VCSEL array modules are electrically connected to the ASICs through the flexible connector. In a decision step 810 if VCSEL transceiver modules are to be used, control is passed to step 812, if not, control is passed to step 816. In a step 812 a plurality of VCSEL transceiver modules are attached to a flexible connector. In a step 814 the VCSEL transceiver modules are electrically connected to the ASICs through the flexible connector. In a decision step 816 if optical receiver modules are to be used, control is passed to step 818, if not, control is passed to step 822. In a step 818 a plurality of optical receiver modules are attached to a flexible connector. In a step 820 the optical receiver modules are electrically connected to the ASICs through the flexible connector. In a decision step 822 if a heat spreader is to be added to the module, control is passed to step 824, if not, control is passed to the end step 826. In a step 824 a heat spreader is mechanically attached to the substrate such that it is thermally coupled to at least one ASIC.

The foregoing description of the present invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A circuit module comprising:
   a module substrate;
   an ASIC attached to said substrate;
   at least one flexible connector attached to said substrate and electrically coupled to said ASIC, wherein said flexible connector is a flexible circuit board capable of performing a 90-degree bend; and
   a plurality of VCSEL array modules attached to said at least one flexible connector and electrically coupled to said ASIC through said at least one flexible connector.

2. The circuit module as recited in claim 1, wherein said VCSEL array modules are electrically coupled to said ASIC through said substrate and said at least one flexible connector.

3. The circuit module as recited in claim 1 further comprising:
   a heat spreader, attached to said substrate, and thermally coupled to said ASIC.

4. The circuit module as recited in claim 1 further comprising:
   a plurality of optical receiver modules attached to said at least one flexible connector and electrically coupled to said ASIC through said at least one flexible connector.

5. The circuit module as recited in claim 4, wherein said optical receiver modules are electrically coupled to said ASIC through said substrate and said at least one flexible connector.

6. A circuit module comprising:
   a module substrate;
   an ASIC attached to said substrate;

at least one flexible connector attached to said substrate and electrically coupled to said ASIC, wherein said flexible connector is a flexible circuit board capable of performing a 90-degree bend; and a plurality of optical receiver modules attached to said at least one flexible connector and electrically coupled to said ASIC through said at least one flexible connector.

7. The circuit module as recited in claim 6, wherein said optical receiver modules are electrically coupled to said ASIC through said substrate and said at least one flexible connector.

8. The circuit module as recited in claim 6 further comprising:

a heat sink, attached to said substrate, and thermally coupled to said ASIC.

9. A circuit module comprising:

a module substrate;

an ASIC attached to said substrate;

at least one flexible connector attached to said substrate and electrically coupled to said ASIC, wherein said flexible connector is a flexible circuit board capable of performing a 90-degree bend; and a plurality of VCSEL transceiver modules attached to said at least one flexible connector and electrically coupled to said ASIC through said at least one flexible connector.

10. The circuit module as recited in claim 9, wherein said VCSEL transceiver modules are electrically coupled to said ASIC through said substrate and said at least one flexible connector.

11. The circuit module as recited in claim 9 further comprising:

a heat spreader, attached to said substrate; and thermally coupled to said ASIC.

12. The circuit module as recited in claim 9 further comprising:

a plurality of VCSEL array modules attached to said at least one flexible connector and electrically coupled to said ASIC through said at least one flexible connector.

13. The circuit module as recited in claim 12, wherein said VCSEL array modules are electrically coupled to said ASIC through said substrate and said at least one flexible connector.

14. The circuit module as recited in claim 12 further comprising:

a heat spreader, attached to said substrate, and thermally coupled to said ASIC.

15. The circuit module as recited in claim 9 further comprising:

a plurality of optical receiver modules attached to said at least one flexible connector and electrically coupled to said ASIC through said at least one flexible connector.

16. The circuit module as recited in claim 15, wherein said optical receiver modules are electrically coupled to said ASIC through said substrate and said at least one flexible connector.

17. The circuit module as recited in claim 15 further comprising:

a heat spreader, attached to said substrate, and thermally coupled to said ASIC.

18. A method for construction of a circuit module comprising the steps of:

a) providing a module substrate;

b) attaching an ASIC to the substrate;

c) attaching a plurality VCSEL array modules to at least one flexible connector, wherein said flexible connector is a flexible circuit board capable of performing a 90-degree bend;

d) attaching the at least one flexible connector to the substrate; and e) electrically coupling the ASIC to the VCSEL array module through the at least one flexible connector.

19. The method for construction of a circuit module as recited in claim 18, wherein the ASIC is electrically coupled to the VCSEL array modules through the substrate and the at least one flexible connector.

20. The method for construction of a circuit module as recited in claim 18, further comprising the stop of:

f) attaching a heat spreader to the substrate, wherein the heat spreader is thermally coupled to the ASIC.

21. The method for construction of a circuit module as recited in claim 18, further comprising the steps of:

f) attaching a plurality of optical receiver modules to at least one flexible connector; and g) electrically coupling the ASIC to the optical receiver module through the at least one flexible connector.

22. The method for construction of a circuit module as recited in claim 21, wherein the ASIC is electrically coupled to the optical receiver modules through the substrate and the at least one flexible connector.

23. A method for construction of a circuit module comprising the steps of:

a) providing a module substrate;

b) attaching an ASIC to the substrate;

c) attaching a plurality of optical receiver modules to at least one flexible connector, wherein said flexible connector is a flexible circuit board capable of performing a 90-degree bend;

d) attaching the at least one flexible connector to the substrate; and e) electrically coupling the ASIC to the optical receiver modules through the at least one flexible connector.

24. The method for construction of a circuit module as recited in claim 23, wherein the ASIC is electrically coupled to the optical receiver modules through the substrate and the at least one flexible connector.

25. The method for construction of a circuit module as recited in claim 23, further comprising the step of:

f) attaching a heat spreader to the substrate, wherein the heat spreader is thermally coupled to the ASIC.

26. A method for construction of a circuit module comprising the steps of:

a) providing a module substrate;

b) attaching an ASIC to the substrate;

c) attaching a plurality of VCSEL transceiver modules to at least one flexible connector, wherein said flexible connector is a flexible circuit board capable of performing a 90-degree bend;

d) attaching the at least one flexible connector to the substrate; and e) electrically coupling the ASIC to the VCSEL transceiver modules through the at least one flexible connector.

27. The method for construction of a circuit module as recited in claim 26, wherein the ASIC is electrically coupled to the VCSEL transceiver modules through the substrate and the at least one flexible connector.

28. The method for construction of a circuit module as recited in claim 26, further comprising the step of:

f) attaching a heat spreader to the substrate, wherein the heat spreader is thermally coupled to the ASIC.

29. The method for construction of a circuit module as recited in claim 26, further comprising the steps of:
  f) attaching a plurality of VCSEL array modules to the at least one flexible connector; and
  g) electrically coupling the ASIC to the VCSEL array modules through the at least one flexible connector.

30. The method for construction of a circuit module as recited in claim 29, wherein the ASIC is electrically coupled to the VCSEL array modules through the substrate and the at least one flexible connector.

31. The method for construction of a circuit module as recited in claim 26, further comprising the steps of:
  attaching a plurality of optical receiver modules to the at least one flexible connector; and
  g) electrically coupling the ASIC to the optical receiver modules through the at least one flexible connector.

32. The method for construction of a circuit module as recited in claim 31, wherein the ASIC is electrically coupled to the optical receiver modules through the substrate and the at least one flexible connector.

* * * * *

UNITED STATES PATENT AND TRADEMARK OFFICE
CERTIFICATE OF CORRECTION

PATENT NO. : 6,922,496 B2 Page 1 of 1
APPLICATION NO. : 10/355663
DATED : July 26, 2005
INVENTOR(S) : Terrel L. Morris It is certified that error appears in the above-identified patent and that said Letters Patent is hereby corrected as shown below:

In column 7, line 33, in Claim 11, delete "substrate;" and insert -- substrate, --, therefor.

In column 8, line 12, in Claim 20, delete "stop" and insert -- step --, therefor.

In column 10, line 1, in Claim 31, insert -- f) -- before "attaching".

Signed and Sealed this

Sixth Day of April, 2010

David J. Kappos
*Director of the United States Patent and Trademark Office*